United States Patent [19]

Johnson et al.

[11] 4,105,479
[45] Aug. 8, 1978

[54] PREPARATION OF HALOGEN DOPED MERCURY CADMIUM TELLURIDE

[75] Inventors: Eric Shanks Johnson; Joseph Lawrence Schmit, both of Minnetonka, Minn.

[73] Assignee: Honeywell, Inc., Minneapolis, Minn.

[21] Appl. No.: 875,266

[22] Filed: Feb. 6, 1978

Related U.S. Application Data

[62] Division of Ser. No. 757,271, Jan. 6, 1977, Pat. No. 4,086,106.

[51] Int. Cl.² ............................................. H01L 21/04
[52] U.S. Cl. ............................... 148/189; 136/89 ST; 252/62.3 ZT; 357/11
[58] Field of Search .................... 75/134 H, 135, 139; 136/89 CD, 89 ST; 148/1.5, 33, 186, 187, 188, 189; 252/62.3 ZT; 357/11

[56] References Cited

U.S. PATENT DOCUMENTS

| | | | |
|---|---|---|---|
| 3,051,839 | 8/1962 | Carlson et al. | 136/89 CD |
| 3,191,045 | 6/1965 | Colman | 136/89 CD |
| 3,666,450 | 5/1972 | Nakamura et al. | 75/134 H |
| 3,767,471 | 10/1973 | Kasper et al. | 148/1.5 |
| 3,780,427 | 12/1973 | Jenkins | 148/1.5 X |

Primary Examiner—G. Ozaki
Attorney, Agent, or Firm—John S. Munday

[57] ABSTRACT

Mercury cadmium telluride is disclosed having a quantity of a halogen donor material preferably selected from the group consisting of bromine and iodine dispersed therein in an amount sufficient to measurably increase the donor concentration. Also disclosed are PN junctions formed using this donor material. A method of introducing the donor material is additionally disclosed.

18 Claims, 6 Drawing Figures

HALL COEFFICIENT VERSUS INVERSE TEMPERATURE FOR SAMPLES TAKEN FROM SURFACE AND CORE REGIONS OF $Hg_{0.6}Cd_{0.4}Te$ DIFFUSED WITH I AND Br AT 650°C AND SLOW COOLED, AND FOR UNDOPED MATERIAL SUBJECTED TO A SIMILAR HEAT TREATMENT.

PREPARATION OF HALOGEN DOPED MERCURY CADMIUM TELLURIDE

The invention herein described was made in the course of or under a contract or subcontract thereunder (or grant) with the Department of the Air Force.

This is a division of application, Ser. No. 757,271, filed Jan. 6, 1977, now U.S. No. 4,086,106.

BACKGROUND OF THE INVENTION

The present invention is concerned with mercury cadmium telluride semiconductor devices. In particular, the present invention is directed to a method of introducing impurities into mercury cadmium telluride. For the purposes of this specification, the common chemical equations for mercury cadmium telluride (Hg,Cd)Te or $Hg_{1-x}Cd_xTe$, will be used.

Mercury cadmium telluride is an intrinsic photodetector material which consists of a mixture of cadmium telluride, a wide gap semiconductor ($E_g = 1.6eV$), with mercury telluride, which is a semimetal having a negative energy gap of about $-0.3eV$. The energy gap of the alloy varies approximately linearly with $x$, the mole fraction of cadmium telluride in the alloy. By properly selecting $x$, it is possible to obtain (Hg,Cd)Te detector material having a peak response over a wide range of infrared wavelengths. High performance (Hg,Cd)Te detectors have been achieved for wavelengths of from about one to about 30 microns.

Mercury cadmium telluride photodiodes have found increasing use in recent years. With this increasing use, more sophisticated photodiodes such as (Hg,Cd)Te reach-through avalanche photodiodes have become desirable. As a result, improved methods of forming PN junctions in (Hg,Cd)Te have become highly desirable. Also, other uses of either P-type or N-type material doped to various degrees have found uses not previously considered.

In another area of technical development. (Hg,Cd)Te is of particular importance as a detector material for the important 8 to 14 micron atmospheric transmission "window." Extrinsic photoconductor detectors, noteably mercury doped germanium, have been available with high performances in the 8 to 14 micron wavelength interval. These extrinsic photoconductors, however, require very low operating temperatures of below 30° K. (Hg,Cd)Te intrinsic photodetectors, having a spectral cutoff of 14 microns, on the other hand, are capable of high performance at 77° K.

The possible application of (Hg,Cd)Te as an intrinsic photodetector material for infrared wavelengths was first suggested by W. G. Lawson, et al., *J. Phys. Chem. Solids*, 9, 325 (1959). Since that time extensive investigation of (Hg,Cd)Te detectors has been achieved for wavelengths from about 1 to 30 microns.

Despite the potential advantages of (Hg,Cd)Te as an infrared detector material, (Hg,Cd)Te photodetectors have recently found wide use in infrared detector systems. A difficulty with (Hg,Cd)Te has been in preparing high quality, uniform material in a consistent manner. The preparation of (Hg,Cd)Te crystals having the desired conductivity type, has been found to be particularly difficult.

Several properties of the (Hg,Cd)Te alloy system cause the difficulties which have been encountered in preparing (Hg,Cd)Te. First, the phase diagram for the alloy shows a marked difference between the liquidus and solidus curves, thus resulting in segregation of CdTe with respect to HgTe during crystal growth. Crystal growth methods, which involve slow cooling along the length of an ingot, produce an inhomogeneous body of (Hg,Cd)Te. Second, the high vapor pressure of Hg over the melt requires special care to maintain melt stoichiometry. Third, the segregation of excess Te can give rise to a pronounced constitutional super cooling.

A number a bulk growth techniques have been investigated. Zone melting methods for preparing (Hg,Cd)Te have been developed by B. E. Bartlett, et al, *J. Mater. Sci.*, 4, 266 (1969); E. Z. Dzuiba, *J. of Electrochem. Soc.*, 116, 104 (1969); and R. Ueda, et al., *J. Crystal Growth*, 13/14, 668 (1972). ). Still other bulk growth techniques for (Hg,Cd)Te have been described by J. Blair, et al., *Conference on Metallurgy of Elemental and Compound Semiconductors*, 12, 393 (1961) and J. C. Wooley, et al., *J. Phys. Chem. Solids*, 13, 151 (1960).

All of the bulk growth techniques require additional post-growth processing steps to produce photodetectors. The crystal must be sliced and the surface prepared by polishing and etching. The (Hg,Cd)Te slide is then epoxied to a substrate such as germanium. This is a particular disadvantage in the fabrication of detector arrays, since it is inconvenient, expensive and generally unsatisfactory to fabricate arrays by assembling discrete detector elements. The epoxy layer, in addition to complicating detector and detector array fabrication, results in a thermal barrier between the (Hg,Cd)Te and the substrate. This thermal barrier can adversely affect performance when significant heating occurs during use.

Epitaxial growth techniques defined below offer the possibility of eliminating the epoxy layer and avoiding many of the post-growth processing steps required for bulk growth techniques. An epitaxial layer is a smooth continuous film grown on a substrate, such that the film crystal structure corresponds to and is determined by that of the substrate. The desired epitaxial layer is single crystal with uniform thickness and electrical properties. The substrate has a different composition or electrical properties from that of the epitaxial layer.

Vapor phase epitaxial growth techniques have been investigated in an attempt to grow (Hg,Cd)Te layers. One vapor phase epitaxial growth technique which has been investigated is the vapor transport of the three constituent elements to a substrate with compound and alloy formation at that point. The vapor transport generally involves additional materials as transport agents, such as halogens. The vapor transport techniques has been described by R. Ruehrwein (U.S. Pat. No. 3,496,024), G. Manley, et al., U.S. Pat. No. (3,619,282), D. Carpenter, et al., U.S. Pat. No. (3,619,283) and R. Lee, et al., U.S. Pat. No. (3,642,529).

Another vapor phase epitaxial growth process has been studied by R. J. Hager, et al., U.S. Pat. No. (3,725,135) and by G. Coehn-Solal, et al., *Compt. Rend.*, 261, 931 (1965). This approach involves an evaporation-diffusion mechanism without the use of any additional materials as transport agents. In this method, a single crystal wafer of CdTe is used as the substrate, and either HgTe or (Hg,Cd)Te is used as the source. At a high enough temperature the material evaporates from the source and migrates in the vapor phase to the CdTe substrate, on which it deposits epitaxially.

In spite of their apparent advantage, epitaxial films of (Hg,Cd)Te formed by vapor phase techniques have been less satisfactory than (Hg,Cd)Te crystals formed by bulk growth because of a compositional gradient along the crystal growth direction which has made them less desirable for detector applications.

Other epitaxial growth techniques have also been attempted. R. Ludeke, et al, *J. Appl. Phys.*, 37, 3499 (1966) grew epitaxial films of (Hg,Cd)Te on single crystal barium fluoride substrates by flash evaporation in vacuum. The samples were grown for studies of optical properties. The technique is probably not practical for the preparation of detector material. H. Krause, et al., *J. Electrochem. Soc.*, 114, 616 (1967), deposited films of (Hg,Cd)Te on single crystal substrates of sodium chloride, germanium and sapphire by means of cathodic sputtering. The resulting films were amorphous as deposited and became crystalline only upon subsequent annealing. The formation of (Hg,Cd)Te by mercury ion bombardment of CdTe has been attempted by N. Foss, *J. Appl. Phys.*, 39, 6029 (1968). This approach was not successful in forming an epitaxial layer.

Another epitaxial growth technique, liquid phase epitaxy, has been used with success in growing other semiconductor materials and in growing garnets for bubble memory applications. In particular, liquid phase epitaxy has been used successfully in the preparation of gallium arsenide, gallium phosphide and lead tin telluride. These materials generally differ from (Hg,Cd)Te, however, in that they (GaAs and GaP) do not have all the severe segregation problem present in (Hg,Cd)Te nor do they have the problem of high vapor pressure of mercury over the melt.

U.S. Pat. No. 3,718,511 M. Moulin, which describes liquid phase epitaxial growth of lead tin telluride and lead tin selenide, suggests that analogous growth arrangements could be made for the alloys zinc selenide telluride and (Hg,Cd)Te. The patent, however, gives specific examples of liquid phase epitaxy only for lead tin telluride and lead tin selenide. Despite the suggestion by Moulin, prior attempts to grow (Hg,Cd)Te by liquid phase epitaxy have provided unsuccessful. Thermodynamic considerations or experimental difficulties have prevented achievement of detector-grade (Hg,Cd)Te material.

However, high quality detector-grade (Hg,Cd)Te epitaxial layers have been formed by the liquid phase epitaxial growth techniques of U.S. Pat. No. 3,902,924. A liquid solution of mercury, cadmium and tellurium is formed and is contacted with a substrate. The liquid solution in the boundary layer next to the substrate has a liquidus composition which is corresponding to the solidus composition of the desired (Hg,Cd)Te layer at the growth temperature by the appropriate tie line. Supersaturation produces growth of a layer of (Hg,Cd)Te on the substrate.

The electrical properties of mercury cadmium telluride can be altered either by changing the stoichiometry or by foreign impurity doping. It is generally theorized that interstitial mercury and cadmium produce N-type conductivity while mercury and cadmium vacancies as well as tellurium interstitials produce P-type conductivity. In Applied Physics Letters 10, 241 (1967) C. Verie and J. Ayas suggested the formation of PN junctions in mercury cadmium telluride by the adjustment of stoichiometry. The formation of PN junctions by diffusion of foreign impurities into mercury cadmium telluride is complicated by two requirements. First, it has been thought that the impurity must be able to be diffused into mercury cadmium telluride at a reasonably low temperature. This is necessary to prevent excessive dissociation of the mercury telluride, which would drastically change stoichiometry. The relatively small dissociation energy of mercury telluride greatly complicates the diffusion and annealing procedures for junction preparation. Second, the impurity atom must not completely replace mercury in the lattice and form yet another compound rather than simply dope the crystal. This problem is also due to the small dissociation energy of mercury telluride. Examples of compounds formed by impurities include $In_2Te_3$, $TeI_2$ and $TeI_4$. None of these materials affect the donor or acceptor concentration in the manner desired.

In U.S. Pat. No. 3,743,553, PN junctions are formed in an N-type body of mercury cadmium telluride by depositing a layer of gold on a surface of the N-type body and heating the body to diffuse the gold into the body, thereby forming a region of P-type conductivity in the N-type body.

The formation of PN junctions in (Hg,Cd)Te is complicated by the small dissociation energy of mercury telluride in the alloy. So too are the difficulties incurred in adjusting carrier concentrations of adjoining regions of the same type. The formation of PN junctions must not cause excessive dissociation of the mercury telluride, since this will adversely affect the electrical and optical properties of the resulting devices.

Several techniques have been developed for forming N-type layers on a P-type body of (Hg,Cd)Te. Among these techniques are bombardment with protons, electrons or mercury ions. These techniques create an N-type layer by creating a damage induced donor state. These techniques are described in Foyt, et al, "Type Conversion and N-P Junction Formation in (Hg,Cd)Te Produced by Proton Bombardment," Appl. Phys. Let., 18, 321 (1971); McIngailis, et al., "Electron Radiation Damage and Annealing of (Hg,Cd)Te at Low Temperatures," J. App. Phys., 44, 2647 (1973); and Fiorito, et al., "Hg-Implanted (Hg,Cd)Te Infrared Low Photovoltaic Detectors in the 8 to 14 Micron Range," Appl. Phys. Let., 23, 448 (1973).

Another technique of forming N-type on P-type (Hg,Cd)Te is described by Marine, et al., "Infrared Photovoltaic Detectors from Ion-Implanted (Hg,Cd)Te," Appl. Phys. Let., 23, 450 (1973). This method involves aluminum ion implantation and subsequent anneal at 300° C for 1 hour to form an N-type in a P-type (Hg,Cd)Te body.

Formation of P-type layers on N-type (Hg,Cd)Te, is limited to two techniques. One common method of forming P-type regions in N-type (Hg,Cd)Te is by depositing a gold layer on a surface of the N-type body and then heating the body to diffuse the gold, thereby forming a region of P-type conductivity. This method is described in U.S. Pat. No. 3,743,553, by M. W. Scott, et al. While this method is generally satisfactory, it does have some shortcomings. In particular, it is difficult to form very abrupt, well-defined PN junctions because gold diffuses extremely rapidly in (Hg,Cd)Te. Devices such as reach-through avalanche photodiodes and wide bandwidth photodiodes, therefore, are difficult, if not impossible to fabricate using gold diffusion.

Another method has been proposed in a commonly owned copending application, filed Mar. 1, 1976, having Ser. No. 662,293, now U.S. Pat. No. 4,003,759. That application discloses a method of introducing acceptor impurities into a region of an (Hg,Cd)Te body. This method allows fabrication of an abrupt, well-defined PN junctions in (Hg,Cd)Te, and comprises implanting gold ions into the (Hg,Cd)Te body and heat treating the body at a relatively low temperature for a short duration.

SUMMARY OF THE INVENTION

It has now been discovered that halogens may be used as donor materials for mercury cadmium telluride to measurably increase the donor concentration of the semiconductor. It has been discovered that the bromine and iodine are present at lattice sites on the mercury cadmium telluride crystal, and more specifically that the donors are substituted for tellurium in the mercury cadmium telluride crystal.

It has been found, according to this invention, that halogens and particularly bromine and iodine may be employed to increase the donor concentrations measurably in a region of mercury cadium telluride, such that a region adjacent thereto which is unmodified will form a PN junction with the doped region or an N-N$^+$ type junction, depending upon the characteristics of the semiconductor body.

It has been found that both bromine and iodine can be dispersed in a body of mercury cadmium telluride by the method of contacting the body with a quantity of the donor material and heating the body at a temperature of at least 550° C for a sufficient time to distribute the bromine or iodine within the body and substitute the bromine or iodine for tellurium in the crystal.

In the first step of the method of this invention, a body of mercury cadmium telluride is contacted with a quantity of either bromine or iodine. In a preferred embodiment, this can be done by placing the conductor body in a sealed quartz ampule after thoroughly cleaning the surface to be contacted. An elemental bromine source is placed in the ampule prior to sealing. Upon heating to a relatively hgh temperature, the bromine or iodine, in the gaseous state, contacts the surface of the mercury cadmium telluride and begins to diffuse therein.

During the heating step, the bromine or iodine is diffused into the body of the semiconductor and distributed uniformly therein as a substitution for tellurium in the crystal lattice. It is essential that the temperature of this heating step be at least 550° C and may be as high as slightly less than the solidus temperature for the crystal. Normally, the solidus temperature will be in excess of 700° C for any stoichiometric relationship between the materials of the crystal. A preferred temperature range is from 625° to 675° C, with 650° being the most preferred temperature.

Both bromine and iodine have been found to be relatively slow in diffusing into the mercury cadmium telluride crystal. For that reason, it is necessary to heat at the aforementioned temperature for at least 24 hours. Preferably, the heating step takes from 24 to 180 hours, depending upon the desired depth of penetration.

Both bromine and iodine are expected to substitute at the tellurium sublattice according to the theory of this invention. Diffusions at approximately 300° C were carried out with no changes in electrical properties attributed to the doping effects. The only time an effective doping by either bromine or iodine was achieved was when the temperatures in excess of 550° C were employed. It may be noted that samples diffused at these high temperatures generally showed significant surface erosion after the long times employed.

A plurality of samples were prepared under identical circumstances, with the only variant being the presence or absence of either bromine or iodine. In each case, samples were cut form the same body of semiconductor. In the use of a cool down procedure, which in undoped material, produces an N-type layer of approximately 100 microns thick with a carrier concentration of approximately $2 \times 10^{15}$ per cubic centimeter, carrier type and concentration in a skin layer when an impurity is present provides a sensitive indicator of impurity doping effects. The bromine diffused sample had N-type thermal electric probe response at 77° K to a depth of 125 microns and a P-type core. The standard sample, where no dopant was employed was N-type to a depth of 75 microns. The electron concentration in a skin region of the bromine diffused sample was $8 \times 10^{17}$ atoms per cubic centimeter. For bromine, the high electron concentration in the skin region shows that this impurity is a donor. The electrical activity of bromine is as expected for impurities substituted on the lattice sites, according to the theory of this invention. From these experiments it is concluded that the impurity doping effects of bromine shows that conventional electrical output is obtained from bromine doped mercury cadmium telluride. Bromine does not produce significant doping of the core regions which remain P-type, indicating that the rate limiting step is diffusion and not the activation of the impurity atom onto a tellurium site at the elevated temperature.

The behavior of iodine is very similar to that determined for bromine. Specifically, the iodine diffused material is converted to N-type to a greater depth and has a higher donor concentration than the standard undoped material. Experiments with thin samples taken from bulk material near the surface established that iodine is a donor with properties similar to bromine.

For a more complete understanding of the invention, reference is hereby made to the drawings, in which FIGS. 1-4 show a schematic representation of the method of this invention;

FIG. 5 shows a sectioned view of the device suitable for use in the present invention; and FIG. 6 represents Hall effect coefficients illustrating the compositions of this invention. Carrier concentrations are given approximately by $n = 1/q\, R_H$ or $6.25 \times 10^{18}\, R_H$.

DETAILED DESCRIPTION OF THE DRAWINGS

Figure 1:
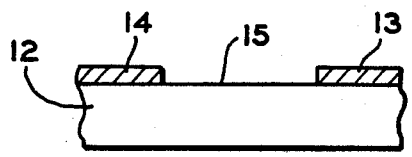

As shown in FIG. 1, a mercury cadmium telluride body 12 is masked with masks 13 and 14 to leave an exposed area 15 for use with the present invention.

Figure 2:
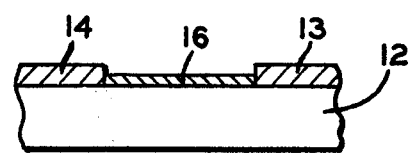

In FIG. 2, a quantity of donor material, either bromine or iodine 16 is placed in contact with the body 12 of mercury cadmium telluride.

As the bromine is heated at a temperature of at least 550° C and preferably at approximately 650° C as described hereinbefore, a region 17 of the body 12 contains dispersed donor material (either bromine or iodine). The depth of penetration of the region 17 is dependent upon the time for which the temperature is maintained above the minimum 550° C.

Figure 3:
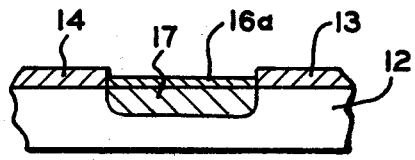

In FIG. 3, the region 17 has been completed, with a portion of undiffused dopant 16a remaining on the surface.

Figure 4:
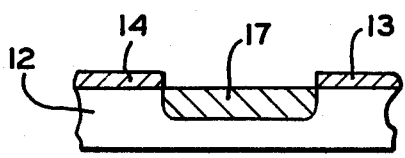

FIG. 4 shows a cleaned body 12 of semiconductor material mercury cadmium telluride with a region 17 having a high concentration of donor material. The junction between the body 12 of mercury cadmium telluride and the donor rich region 17 forms an electrically active junction. In the case where the mercury cadmium telluride is P-type, and sufficient bromine or iodine has been dispersed in region 17 to render it N-type, a PN junction has been formed. Similarly, if the body 12 is N-type, an N–N+ junction has been formed.

Figure 5:
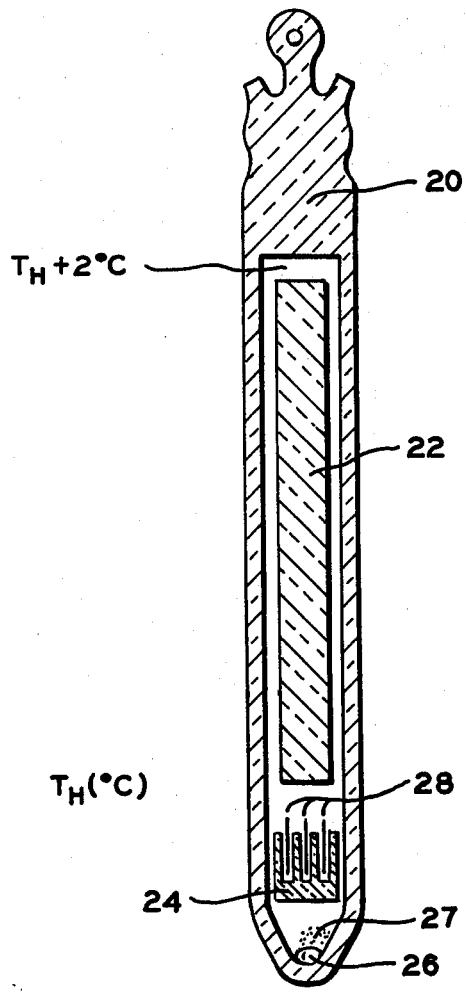

FIG. 5 shows a fused quartz ampule 20 which may be employed to form the materials of the present invention. Contained in the ampule 20 is a quartz plug 22, useful to reduce the total volume. Also contained in the ampule 20 is a quartz sample rack 24 for holding samples of mercury cadmium telluride being treated.

Since the method of this invention requires a significant length of time at a relatively high temperature, care must be taken to prevent damage to the stoichiometric ratios of the mercury cadmium telluride being doped. It has been found that the step of providing a mercury vapor pressure during the heating from a source other than the body substantially reduces any changes in the semiconductor sample. As shown in FIG. 5, a quantity of mercury 26 is placed at the bottom of the ampule 20. This mercury provides a source of vapor pressure during the heating step. In order to more completely protect the integrity of the stoichiometric ratio of materials in the mercury cadmium telluride, a quantity of powdered semiconductor body mercury cadmium telluride 27 is placed in the bottom of the ampule as well. Finally, the mercury cadmium telluride which is to be treated with the donor material of this invention is placed in the sample rack 24 in the form of pieces 28 of the semiconductor. In a preferred embodiment, the samples 28 are cleaned to remove any possible contaminants or other impurities, and then placed in the cleaned sample rack 24. A quantity of the donor material, either bromine or iodine, is placed on the sample 28 and the ampule is evacuated and sealed. The $B_4$ or I is frozen in the ampule to prevent it being evacuated also. The ampule 20 is then placed in a furnace for heating at a temperature $T_H$ of at least 550° C, and as previously described, preferably at 650° C. The upper portion of the ampule 20 is maintained at a temperature of approximately 2° C higher than the diffusion temperature to prevent any region of $H_g$ vapor at pressures less than that corresponding to $T_H$.

Figure 6:
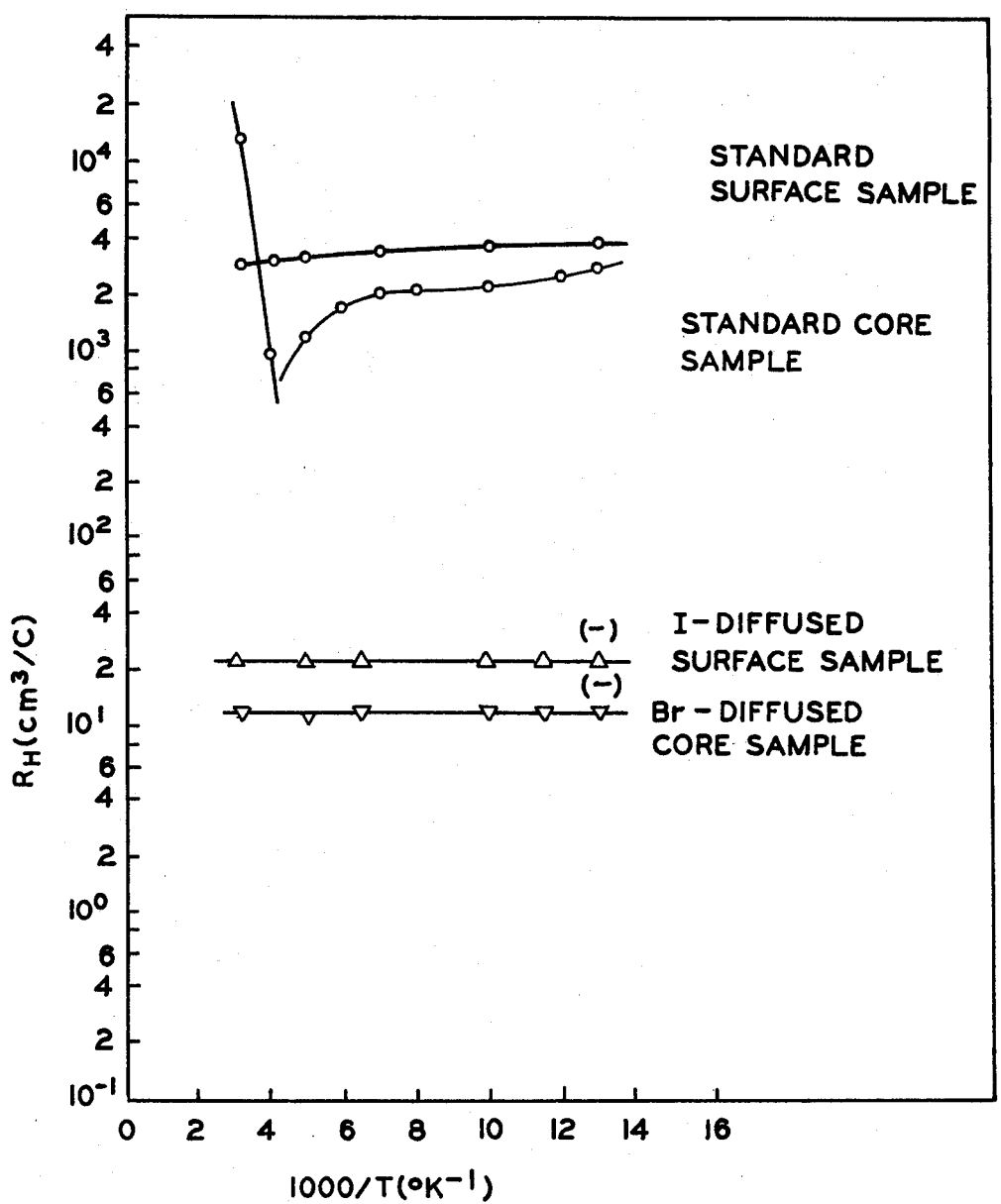

FIG. 6 shows the Hall coefficient versus inverse temperatures for samples made according to the present invention. The carrier concentration resulting from the inclusion of bromine is seen to be approximately $6 \times 10^{17}$ donors per cubic centimeter in the surface layer of the sample. Similar results are shown for iodine. A preferred range of donor material ranges from the $10^{10}$ atoms per cubic centimeter to the $10^{20}$ atoms per cubic centimeter.

The embodiments of the invention in which an exlusive property or right is claimed are defined as follows:

1. A method of adjusting the donor concentration in a body of mercury cadmium telluride, comprising the steps of:

contacting a body of mercury cadmium telluride with a quantity of donor materials selected from the group consisting of bromine and iodine; and heating said body at a temperature of at least 550° C for a sufficient time to distribute said donor material within said body.

2. The method of claim 1 wherein said quantity of donor material ranges from $10^{10}$ atoms per cubic centimeter to $10^{20}$ atoms per cubic centimeter.

3. The method of claim 1 wherein said donor material is present at the lattice sites of said mercury cadmium telluride.

4. The method of claim 1 wherein said donor material is substituted for tellurium in said mercury cadmium telluride.

5. The method of claim 1 wherein said donor material is bromine.

6. The method of claim 1 wherein said donor material is iodine.

7. The method of claim 1 wherein said temperature ranges from 625° to 675° C for at least 24 hours.

8. The method of claim 1 wherein said temperature is maintained for between 24 and 180 hours.

9. The method of claim 1 which further includes the step of providing a mercury vapor pressure during said heating from a source other than said body.

10. The method of claim 9 which further includes the step of providing a quantity of mercury cadmium telluride powder at said temperature during said heating.

11. The method of increasing the donor concentration of a first region of mercury cadmium telluride with respect to a second adjacent region of mercury cadmium telluride, comprising the steps of:

contacting said first region of mercury cadmium telluride with a quantity of donor material selected from the group consisting of bromine and iodine; and heating said body at a temperature of at least 550° C for a sufficient time to distribute said donor material within said body.

12. The method of claim 11 wherein said quantity of donor material ranges from $10^{10}$ atoms per cubic centimeter to $10^{20}$ atoms per cubic centimeter.

13. The method of claim 11 wherein said donor material is present at the lattice sites of said mercury cadmium telluride.

14. The method of claim 11 wherein said donor material is substituted for tellurium in said mercury cadmium telluride.

15. The method of claim 11 wherein said donor material is bromine.

16. The method of claim 11 wherein said donor material is iodine.

17. The method of claim 11 wherein said temperature ranges from 625° to 675° C for at least 20 hours.

18. The method of claim 11 which further includes the step of providing a mercury vapor pressure during said heating from a source other than said body.

* * * * *